United States Patent [19]

Beery

[11] Patent Number: 5,068,734
[45] Date of Patent: Nov. 26, 1991

[54] APPARATUS FOR CONTROLLING A TELEVISION RECEIVER

[76] Inventor: Jack Beery, 907 6th St. SW., Apt. 815 C, Washington, D.C. 20024

[21] Appl. No.: 359,155

[22] Filed: May 31, 1989

[51] Int. Cl.⁵ .............................................. H04N 5/50
[52] U.S. Cl. .............................. 358/191.1; 358/192.1; 455/186
[58] Field of Search ............... 358/191.1, 192.1, 194.1; 455/151, 154, 158, 186

[56] References Cited

U.S. PATENT DOCUMENTS

| | | | |
|---|---|---|---|
| 4,314,375 | 2/1982 | Belisomi | 455/158 |
| 4,317,225 | 2/1982 | Henderson et al. | 455/158 |
| 4,355,415 | 10/1982 | George et al. | 455/185 |
| 4,375,651 | 3/1983 | Templin et al. | 358/191.1 |
| 4,419,769 | 12/1983 | Cohen | 455/182 |
| 4,527,194 | 7/1985 | Sirazi | 358/192.1 X |
| 4,559,561 | 12/1985 | Amarno et al. | 358/192.1 |
| 4,620,229 | 10/1986 | Amano et al. | 358/192.1 X |
| 4,751,578 | 6/1988 | Reiter et al. | 358/194.1 X |
| 4,870,492 | 9/1989 | Hakamada et al. | 455/186 X |
| 4,907,085 | 3/1990 | Bingham | 358/192.1 |
| 4,914,517 | 4/1990 | Duffield | 455/186 |
| 4,959,720 | 9/1990 | Duffield et al. | 358/191.1 |

Primary Examiner—James J. Groody
Assistant Examiner—Mark R. Powell
Attorney, Agent, or Firm—Thomas A. Boshinski

[57] ABSTRACT

A television control system is for selecting a television channel corresponding to a preassigned channel tuning designation. A tuner receives a multi-channel input signal, and in response to a processor signal, tunes out all but one selected channel. A memory stores at least one operator-assigned channel select designation for the channel tuning designations. An operator-actuated control means generates a first data signal representative of a desired channel select designation for one of the channel tuning designations, and a second data signal representative of a desired viewing channel identified by one of the channel select designations. A processor receives the first data signal from the control means, and in response, causes the memory to store the desired channel select designation as corresponding to the tuning designation. Upon receipt of the second data signal, the processor retrieves from the memory the channel tuning designation corresponding to the channel select designation, and generates the processor signal to correspond to the channel tuning designation.

28 Claims, 9 Drawing Sheets

APPARATUS FOR CONTROLLING A TELEVISION RECEIVER

BACKGROUND OF THE INVENTION

The present invention relates generally to devices for viewer control of a television receiver and, more particularly, to such a control adapted especially for use with cable television service.

Historically, television channels have been identified by channel numbers, which numbers correspond both to a particular frequency with which the television signals are broadcast, and to a numerical designation on the controls of the television receiver. Specific channel numbers have been assigned to television broadcasting stations by governmental control agencies so as to minimize interference among the limited number of channels in use, typically by insuring adequate geographic separation between stations of the same channel number.

With the advent of cable television service in recent years, proper separation between different stations having the same channel number designation may no longer be possible. Certain stations which may broadcast on a particular numbered channel in their local area have become regionally or nationally distributed channels through cable service. Further, other channels have become available only on cable service, providing movie, sports and similar special programming. Such channels are typically not associated with any traditional channel number.

Because cable television service provides its channels on frequencies which are different from traditional over-the-air broadcasting, it has become common practice for cable subscribers to tune their television receivers to a desired channel using other than the normal tuning system. Even in the case of so-called "cable ready" receivers, the tuning band is different from that used in the absence of cable. Thus, cable service providers assign stations to channels available within the cable frequency band. These channels are numerical, like those for over-the-air broadcasting, although the total number of such channels may be different.

In general, cable providers assign over-the-air stations available on cable service to cable channels having the same numbers as the non-cable designation. For example, a channel "7" which may be received on the VHF broadcast band will be provided by the cable service on cable channel "7". However, it is not uncommon for more than one channel to be available on cable service having identical channel designations. For example, two stations may be available with both identified for over-the-air broadcasting as channel "17". Further, some cable channels are not available as over-the-air broadcasts in any locations. These channels may not have any numerical channel associated with them, but may be designated by a single word (e.g., "WEATHER," "NEWS," etc.), or by an acronym (e.g., "HBO," "ESPN," etc.).

As a result, cable service providers assign the various channels to numerical designations which may or may not correspond to the over-the-air channel designations with which the viewer is more likely to be familiar. A conversion chart must therefore be provided to the viewer, to enable him to locate the proper numerical designation for the desired channel. This can be awkward and inconvenient for the viewer, particularly in metropolitan areas having more than one cable service provider, or for travelers and others who may not be familiar with the local system.

A similar problem exists for television viewers who receive programming with a satellite receiver. Indeed, the tuning designations of the satellite receiver are even less likely to have some correspondence to the conventional, over-the-air channel designations of the desired programming.

What is needed, therefore, is a means by which cable and satellite television control devices may be made more convenient for the viewer. In particular, such means should enable control of television viewing using channel designations which match those with which the viewer is familiar, such as those published in a local newspaper, or other designations which are more meaningful to the viewer.

SUMMARY OF THE INVENTION

In meeting the foregoing needs, the present invention provides a television control system for selecting a television channel corresponding to a preassigned channel designation. Preferably, the channel designation represents a tuning designation. The system apparatus includes tuner means for receiving a processor signal and a multi-channel input signal, and in response to the processor signal, tuning out all but one channel corresponding to a selected one of the preassigned channel tuning designations. A memory means stores at least one operator-assigned channel select designation for at least one of the channel tuning designations. An operator-actuated control means generates a control output signal comprising one of (a) a first data set representative of a desired channel select designation for one of the channel tuning designations, and (b) a second data set representative of a desired viewing channel identified by an operator selected one of the channel select designations.

A processor means receives the control output signal from the operator-actuated control means, and upon receipt of the first data set, causes the memory means to store the desired channel select designation as corresponding to the one channel tuning designation. Upon receipt of the second data set, the processor means retrieves from the memory means the one of the channel tuning designations corresponding to the operator selected channel select designation, and generates the processor signal to correspond to the one channel tuning designation.

The operator actuated control means may include an alpha- and/or numeric keypad, with the control output signal comprising a string of alpha- and/or numeric characters generated in response to actuation of said keypad. A remote housing may be provided for mounting the keypad, along with means for transmitting the control output signal from the housing to the processor means. The transmitting means may include means for encoding the control signal as an infrared data stream, means for transmitting the infrared data stream, and means connected to the processor means for receiving the infrared data stream.

Alternatively, the remote housing may be for mounting the keypad, the processor means and the memory means, along with means for transmitting the processor signal from the housing to said tuner means.

The apparatus may further include display means for receiving a display signal and displaying characters corresponding thereto. The memory means then includes means for storing at least one series of display characters. The control means includes means for generating a part of the first data set representative of a desired one of the series of characters for each of the channel select designations. The processor means then includes means for, upon receipt of the first data set, additionally causing the memory means to store the desired series of characters as corresponding to one of the channel select designations. Upon receipt of the second data set, the processor means retrieves from the memory means the one of the series of characters corresponding to the operator selected channel select designation, and generates the display signal to correspond to the series of characters for output to the display means.

The memory means may also include means for storing at least up to one marker bit for each of the channel select designations, and means for retaining the channel select designations in an ordered cue. The control means includes means for generating, at the selection of the operator, a part of the first data set representative of the presence of the marker bit associated with one of the channel select designations, and means for generating a third data set representative of a command to advance to a subsequent channel select designation within the cue.

In this case, the processor means, upon receipt of the first data set, causes the memory means to store any of the marker bits associated with one of the channel select designations. Upon receipt of the third data set, the processor means reviews the cue to determine the next of the channel select designations to have one of the marker bits associated therewith, and generates the processor signal to correspond to the next channel select designation.

As a further alternative, the memory means may include means for storing, in association with at least one of the channel select designations, means for denoting the one channel select designation as "restricted," whereby access to such channel is limited to those who have knowledge of a password or the like. The control means then includes means for generating the first data set to include the means for denoting the one channel select designation as restricted, and means for generating a third data set representative of a password or authorization code.

The processor means, upon receipt of the first data set, causes the memory means to store the means for denoting the one channel select designation as restricted. Upon receipt of the second data set, in the event the operator selected channel select designation has associated therewith means for denoting the channel select designation as restricted, the processor means prevents generation of the processor signal unless and until receipt of the third data set.

Accordingly, it is an object of the present invention to provide a control system for television receivers, particularly although not limited to those receiving cable and/or satellite broadcasts, which is more convenient for use by the viewer; to provide such a system wherein the viewer or a third party may select his own channel designations to accommodate his own preference; to provide such a system which may be incorporated into convention television designs; and to provide such a control system which may be added to conventional designs without undue cost or complication.

Other objects and advantages of the present invention will be readily apparent from the following description, the accompanying drawings, and the appended claims.

DETAILED DESCRIPTION OF THE PREFERRED EMBODIMENTS

Figure 1:
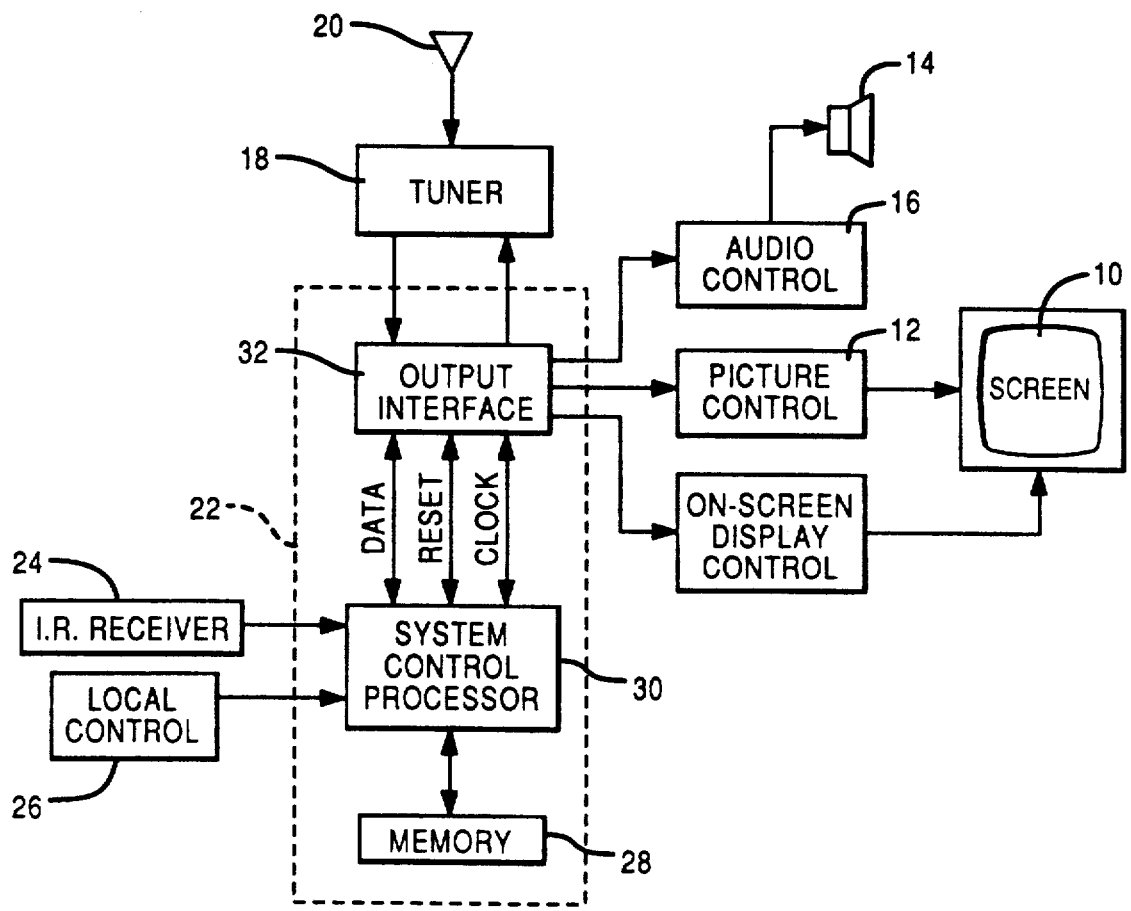
FIG. 1 is a block diagram illustrating the television control system of the present invention incorporated into a television receiver.

A general block diagram of a preferred embodiment of the present invention may be seen generally by reference to FIG. 1. In general, the circuitry comprising the various blocks as shown in FIG. 1 are conventional, and the detailed design of the individual circuits will be readily apparent to one of ordinary skill in such circuitry.

The television system includes a screen 10, under immediate control of picture control circuitry 12 which for description purposes includes various power supply circuits, raster scan circuits, color control circuits and the like which are conventional and typically associated with a television receiver. A speaker 14 or other sound output means receives an audio output signal from audio control circuitry 16, again which includes conventional and typical circuitry including power supply, amplifier, audio filter and similar circuits.

A tuner 18 receives a multi-channel input at 20 and tunes out all but a selected channel for viewing. It will be recognized that the multi-channel input received by tuner 18 at 20 may be a conventional cable input signal, but may also be the input signal received from a satellite transmission receiver. Moreover, the present invention may be used with any television input signal, including a conventional over-the-air broadcast signal received through a conventional antenna.

Tuner 18, and indeed, audio control 16 and picture control 12, operate under the control of processing unit 22, which may be any conventional programmable microprocessor or other means capable of receiving input control signals and producing a corresponding output control signal. Processing unit 22 in turn is controlled by an operator-actuated control means. In a preferred embodiment, operator-actuated control means includes a hand-held remote control unit, illustrated in block diagram form in FIG. 2. Input from the remote unit is received, in a preferred embodiment, in the form of infrared transmissions by infrared receiver 24. This input is in turn supplied to processing unit 22. As an alternative, input may be received from a local control 26, such as a keypad or other control means located on the television receiver. Preferably, local control 26 may be provided in addition to a remote control means.

Processing unit 22 includes memory 28 for storing the control program for controlling the television receiver, control processor 30 for receiving input from memory 28 and operator input from either infrared receiver 24 or local control 26 and executing the control program, and output interface 32 for directing the output from control processor 30 to the appropriate circuits. As is known, these components may be located on one or more integrated circuit chips as appropriate.

Figure 2:
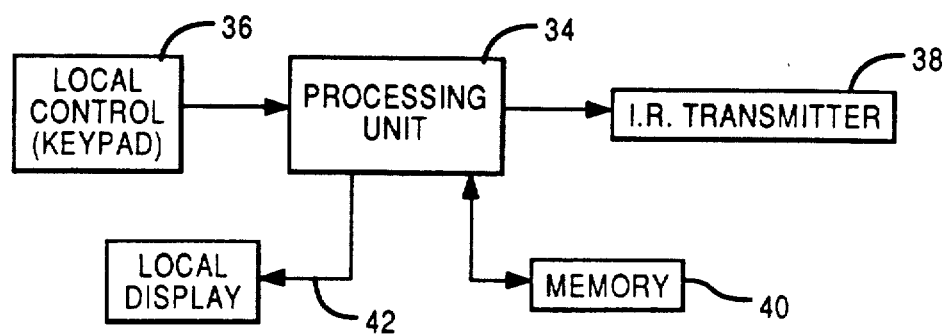
FIG. 2 is a block diagram illustrating a portion of the television control system located within a remote control unit.

One embodiment for a remote control unit may be seen by reference to FIG. 2. The remote unit operates under control of its own processing unit 34, which may be for example a microprocessor located on a single integrated circuit chip. Connected to processor unit 34 is an alpha/numeric keypad 36 for operator input.

In one preferred embodiment, the remote unit is cordless, i.e., without physical connection to the television receiver. Thus, processing unit 34 is connected to a transmitter 38 which generates, preferrable, an infrared signal containing the control information. Such information is transmitted to the television receiver unit, being received by receiver 24. Of course, alterative means for transmitting the control signals to the television receive may be used, such as by other than infrared radiation or ultrasonic waves. In addition, a cable could be used connecting the remote unit to the television receiver.

Associated with processing unit 34 may be a memory 40 which includes some portion of the control data for use in controlling the television receiver. This memory 40 may carry out some functions in place of some portion of memory 28 associated with the system control processor 30 of the processing unit 22 for the television receiver. As another option, a local display 42 may be provided for displaying commands as they are entered through the keypad 36, or for displaying control information concerning the television receiver or its tuning.

An important feature of the present invention is the memory available as memory 28 or as memory 40. These memories are connected to system control processor 30 and processing unit 34, respectively. At least one of these memories can be both read and written by the corresponding processor, and is preferably an electrically erasable programmable read only memory (EE PROM), or a non-volatile random access memory (NV RAM), the latter preferably equipped with a battery-powered back up. Either of these alternatives are well known to those skilled in the art, and are readily commercially available.

The invention enables the viewer of the television receiver to select a desired channel using a channel designation which the viewer or some other operator has previously chosen for the particular channel desired. This designation may be different from the designation assigned by the cable service provider or governmental control agency. In this way, the user can select a designation (or "select code") which makes sense to the individual user. Such a designation may be comprised of numeric characters, alphabetic characters, or both. Afterwards, appropriate keys on the keypad 36 of the remote unit are actuated for channel selection.

It should be recognized that channel designations other than alpha-/numeric characters could be used. For example, the remote unit keypad 36 could include a series of "preset" keys as is common in radio receivers, possibly coded or designated by key shape, color or the like, which the user could program to correspond to certain desired channels. (Such presets, as with channel designations comprised of characters, could be associated with a "display code" as defined below.)

To facilitate further description of the present invention, the following terminology will be used as defined:

"Channel code" is the numerical (and perhaps also alphabetic) tuner designation at which a particular signal may be found. Such characters are the conventional input to a television receiver control system.

"Select code" is the channel designation chosen by the operator for subsequent use in selecting a particular channel.

"Display code" is a series of alpha-/numeric characters chosen by the operator for subsequent display on the television screen or a display panel as a channel is chosen using the select code. The display code may, but does not have to, be different from the select code.

"Cue" is the listing in memory of the various programmed entries made by the operator, wherein each select code is stored along with its corresponding channel code and display code.

Figure 3:
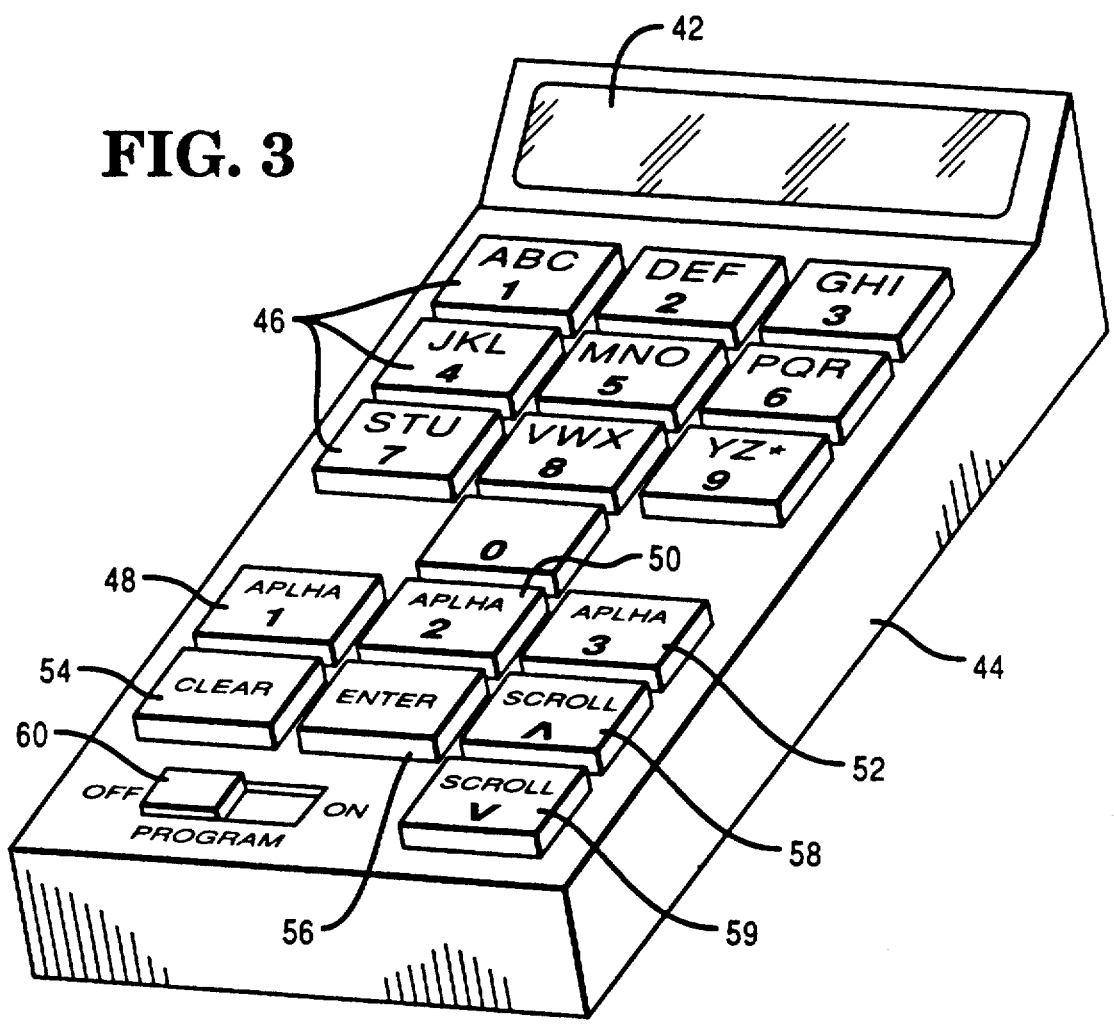
FIG. 3 is a perspective view of a remote control unit which may be used with the control system of FIGS. 1 and 2.

A preferred embodiment for the layout of keypad 36 may be seen on the remote unit shown in FIG. 3. As can be seen, keypad 36 may be mounted in an appropriate housing 44 also containing a power source (not shown) for the remote unit such as a dry cell battery. The keypad includes various specific keys, each with its designation imprinted thereon. For example, alpha- /numeric keys 46 for numerals 0-9 are provided. Alphabetic characters may be provided by the numeric keys as well, with most numeric keys also including up to three alphabetic designations per key. For instances where it is important to specify a particular alphabetic character, "alpha" keys 48, 50 and 52 are provided. An input from "alpha 1" key 48, for example, will indicate to processor 30 that the next key input will be one of the alpha-/numeric keys 46, and that such key should be interpreted as the first alphabetic character on the particular key. For instance, "alpha 1" followed by the "5" key will represent the character "M". Similarly, "alpha 2" followed by "4" will represent the character "K".

Keypad 36 also includes several special keys. The "clear" key 54 and "enter" key 56 are used in programming memory 28 and/or 40, as will be described below. Other keys conventional in remote television control devices may be provided, such as channel advance or "scroll" keys 58 and 59 to step up or down through a series of channel selections.

Also for use in programming memory 28 and/or 40 is a "program" switch 60, which may for example be a conventional slide switch. Switch 60 is used to alert processor 30 and/or processing unit 34, as will be described below, that input keystrokes are to be used in programming the memory.

It will, of course, be recognized that the remote unit shown in FIG. 3 includes only those controls critical to the system as described herein. It will be readily apparent that other controls may be provided in a known manner on the remote control unit, such as power on/off and audio volume and muting controls.

Operation of the control system is in accordance with a program resident in either system control processor 30, located within the television receiver, or processing unit 34 located within the remote unit. Advantages to either location will be apparent to those skilled in the art, although it may be noted that operation of the control system by the remote control processor enables the control system to function in a "universal" remote; that is, the remote control unit incorporating the control system described herein may be used with any television receiver capable of being remotely controlled. This permits the remote control to be manufactured by one other than the television manufacturer, whereas controlling the system from the television receiver as a practical matter requires the remote to be produced by the television manufacturer. On the other hand, this latter configuration simplifies or eliminates the processing unit 34 from the remote unit.

A preferred embodiment for the control program, regardless of which processor executes the program, may be seen by reference to FIGS. 4-7. The control system operates in either a "channel selection" mode, wherein the operator selects the desired viewing channel using channel designations (select codes) which the viewer or other operator has previously assigned, or in a "program" mode, wherein the select code assignments are made, changed, reviewed and the like. This latter mode will be described first, with specific reference made to FIG. 4.

The program mode operates in the preferred embodiment as an interrupt; i.e., the program operates in its normal, program selection mode until the program switch 60 is actuated. At such time, the program immediately moves to the routine shown in FIG. 4 beginning at block 62. Conversely, the program mode routine may be interrupted at any time by actuating the program switch 60 to return the control to the normal channel selection mode.

At block 64, the operator is prompted "SELECT TV CHAN" to indicate whether he wishes to assign a channel selection code. An appropriate response in the form of "1" for yes and "0" for no, followed by the enter key (blocks 66 and 68) is entered. If yes, the program moves (block 70) to the select code entry routine shown in FIG. 5. If no, the program prompts the operator in block 72 for "SELECT CUE" wherein the operator may review the cue of previously assigned select and display codes. A response of "1" for yes and "0" for no is followed by the enter key, blocks 74 and 76, whereafter the program either moves to the select cue routine (block 78) shown in FIG. 6, or displays a "CLEAR PROGRAM" prompt at block 80. This prompt gives the operator the option to entirely clear the memory of select and display codes.

In response to this prompt, the operator enters "1" for yes and "0" for no, followed by the enter key, blocks 82 and 84. If the response is no ("0"), the program reverts to the "SELECT TV CHAN" prompt at block 64. If, on the other hand, the response is yes ("1"), the operator is given a confirmation prompt of "ARE YOU SURE?", block 86, to which the operator responds with "1" or "0" followed by the enter key, blocks 88 and 90. Only if an affirmative response is received will the memory be cleared, block 92. In the preferred embodiment, clearing of the memory substitutes codes wherein the select code is made equal to the tuning channel so that the television receiver may be used in a conventional manner.

Figure 4:
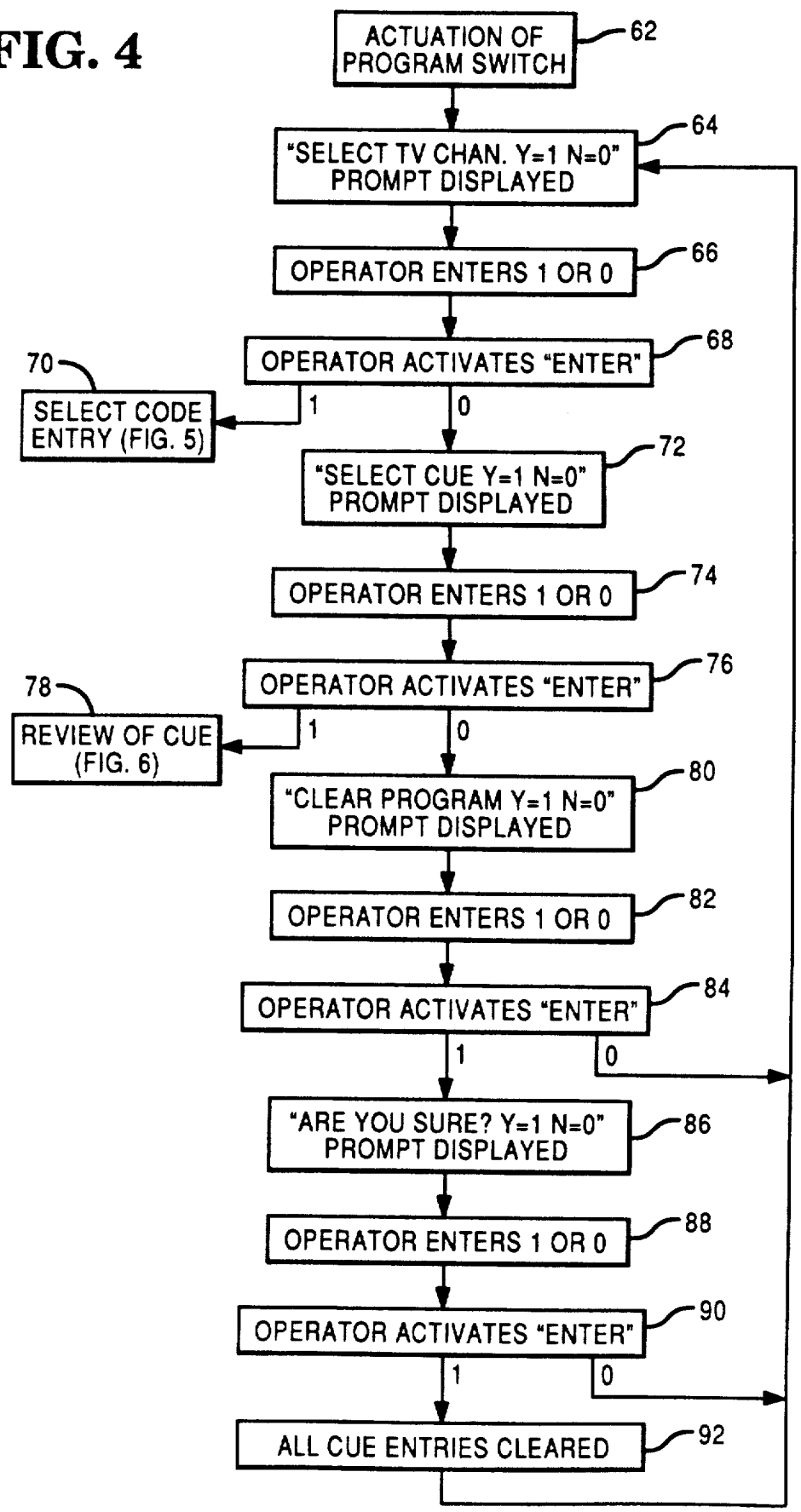
FIG. 4, FIG. 5 (comprising FIGS. 5A and 5B), FIG. 6 (comprising FIGS. 6A and 6B) and FIG. 7 (comprising FIGS. 7A and 7B) are flowchart diagrams of a program for operating the control system of the present invention.
Figure 5A:
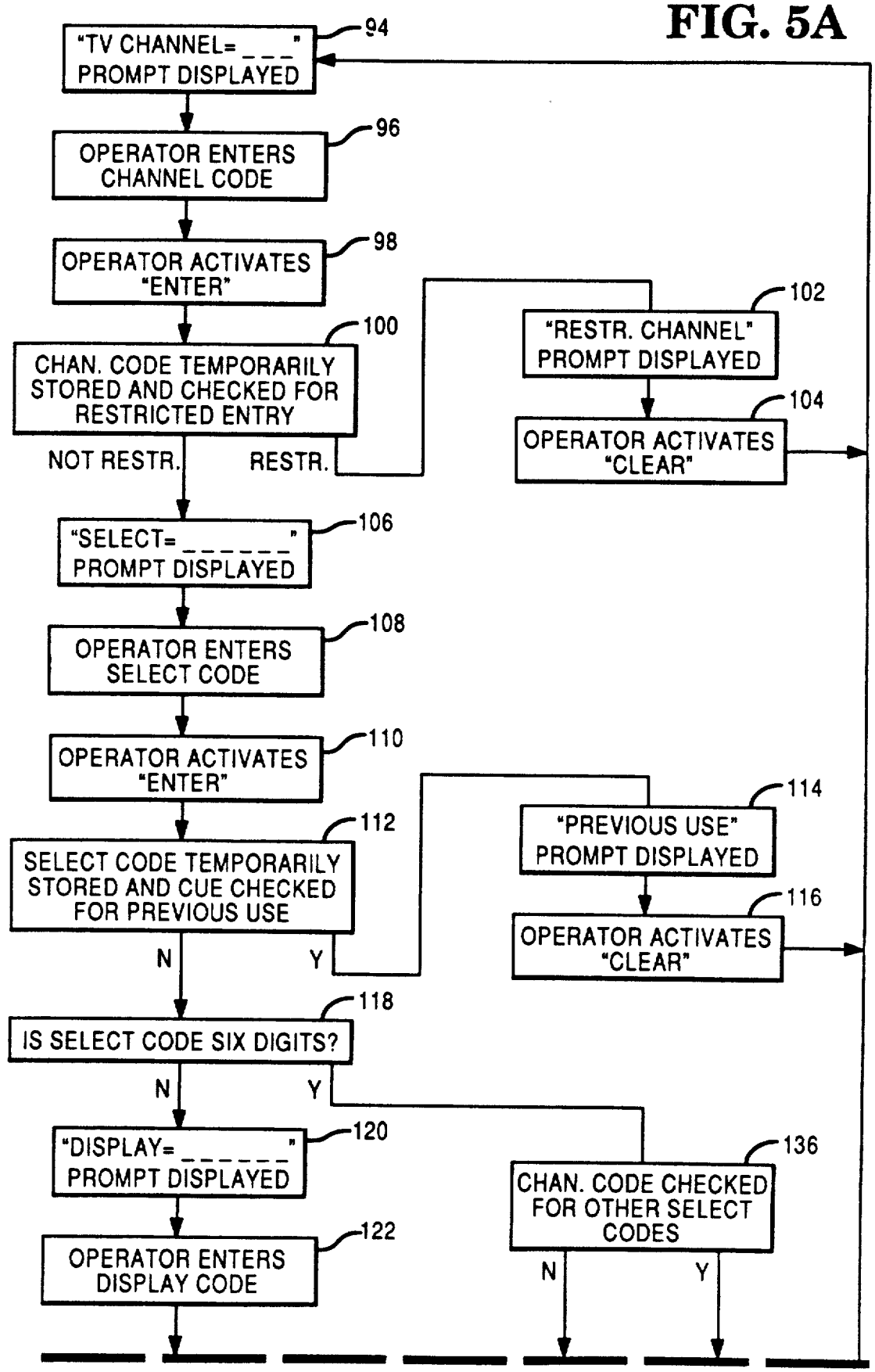
Figure 5B:
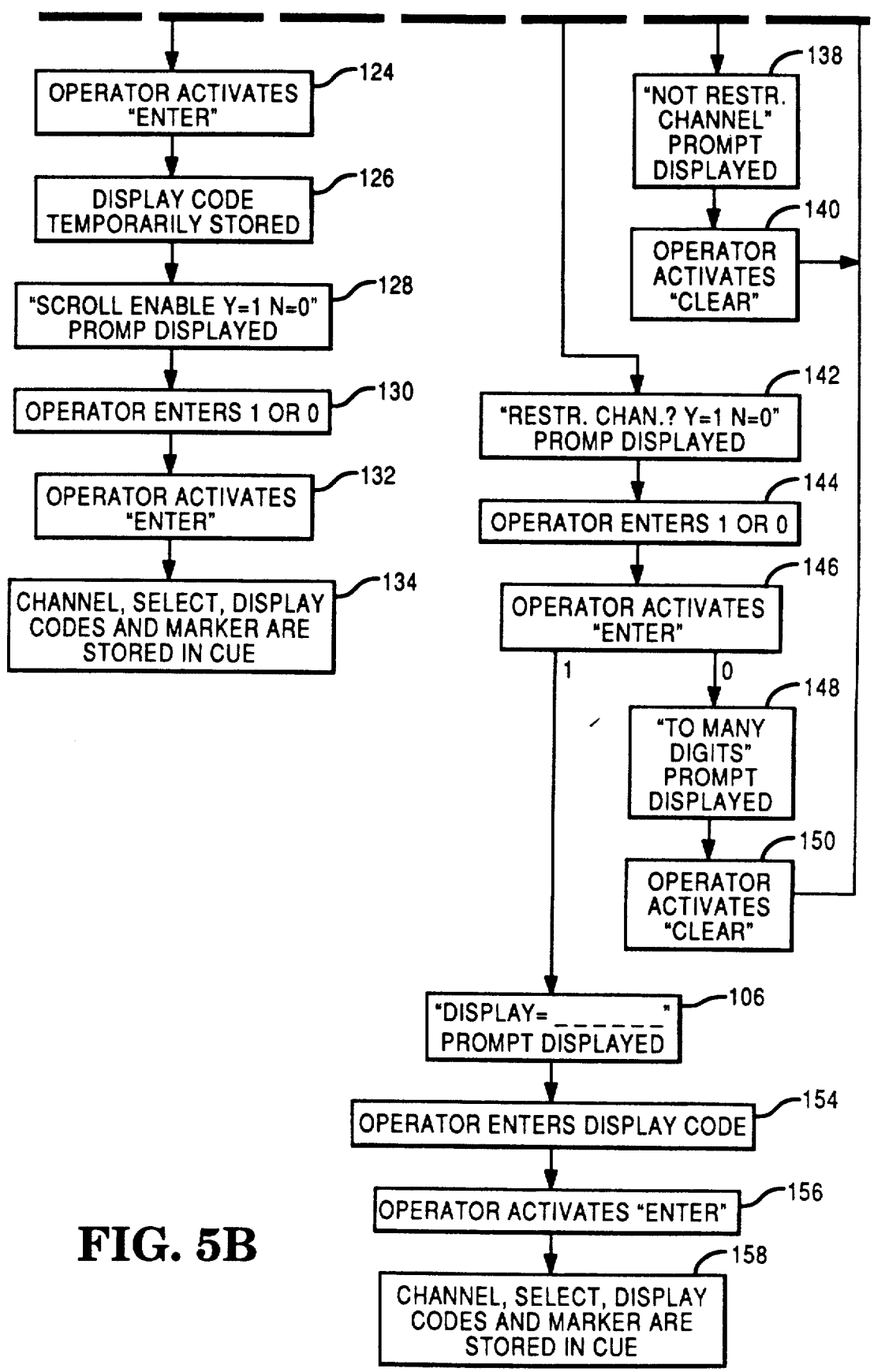

Referring now to FIG. 5 (comprising FIGS. 5A and 5B), the select code entry routine may be seen. This routine is entered from block 70 in FIG. 4, and commences with block 94 whereat the operator is prompted "TV CHANNEL=____". In response, the operator enters the characters (typically numeric) corresponding to the tuner designation (or "channel code") for the desired channel, block 96. Upon receipt of an "enter" keystroke, block 98, the entered channel code is temporarily stored in memory, block 100, while the channel cue is checked to determine whether any select codes have been previously assigned to the channel on a restricted (or password) basis.

One feature of the present invention is the ability to designate particular channels such that they may only be selected by entry of a password. Any selectable channel may be made such a restricted channel, thereby enabling, for example, a parent to restrict access to certain channels by children. As will be seen from the further description of the preferred embodiment, such feature can be readily incorporated into the control system of the present invention.

As noted, when a particular channel code is entered for assigning a select code thereto, a check is made to determine whether this channel has previously been assigned a restricted access (password required) select code. This is to ensure that a restricted channel is not assigned both a restricted and unrestricted select code, thereby defeating the restricted access. If the channel has been made restricted, a message "RESTRICTED CHANNEL" is displayed as flashing on the remote control unit display or on the television screen, block 102. The operator in response actuates the "clear" key 54, block 104, whereafter the program returns to block 94 to request entry of a tuner channel.

If the requested tuner channel has not been previously made restricted, as determined at block 100, the operator is prompted (block 106) with "SELECT-=_____". In response, the operator enters his desired select code of up to six characters, block 108, followed by the enter key, block 110. A check is made at block 112 as to whether the entered select code has been previously used and if so, a flashing display "PREVIOUS USE" is shown (block 114) until the operator actuates the "clear" key (block 116).

In the preferred embodiment, a select code may contain a maximum of six characters, although a code for a restricted channel must contain six characters and an unrestricted channel code must include less than six. Of course, it will be recognized that any other means may be used for distinguishing between restricted and unrestricted channels, but in the program of the preferred embodiment, a check of the entered code is next made at block 118 to determine whether the entered select code includes six characters. If less than six characters are found, indicating a nonrestricted code, the program moves to block 120.

One further feature of the preferred embodiment of the present invention is the ability to select a display code which differs from the select code used by the operator to choose a channel for viewing. When a channel is selected for viewing, the display code is displayed either on the hand held remote display, on a display associated with the television receiver controls, or directly on the television screen. As can be seen, the display code may be entirely different from the select code (but need not be), so that the operator may choose, for example, the channel number of the selected channel to be displayed along with the station call letters, network affiliation, or other description. Thus, at block 120, the operator is prompted "DISPLAY=_____", with a maximum display of six characters provided in this embodiment. The operator enters these characters at block 122, actuates the enter key at block 124, and the display code is temporarily stored at block 126.

Yet another feature of the preferred embodiment is the ability of the operator to designate only certain channels to be placed into a "scroll" so that the operator may later "scroll" by actuating a single key through a number of frequently watched channels. Those channels to be placed in the scroll are flagged with a marker bit. Thus, at block 128, the operator is presented the opportunity to so mark the channel by responding to the prompt "SCROLL ENABLE". At block 130, the operator responds with "1" to enable scrolling of the channel and "0" to not enable, followed by the enter key at 132.

The program the enters the channel code, select code, display code and scroll marker into the channel selection cue in the alpha-numeric order of select code. The program then returns to the point at which the program interrupt was initiated.

It is possible, in addition to the entries made as described above, to provide for entry along with the marker bit one or more order bits. Such entry makes it possible for the operator to predetermine the order of channels during scrolling. Details of the various means by which such a feature could be provided are within the ordinary level of skill within the art.

If, at block 118, the program determines that the entered select code includes six characters, thereby signifying a restricted channel, the program branches to block 136 where a check is made to determine whether any other select codes exist for this tuner channel. If some other select code is noted, indicating that the channel is not in fact a restricted channel, a display is presented at block 138 such as "NOT RESTRICTED CHANNEL". Once the operator clears this display using the clear key, block 140, the program returns to block 94.

If the tuner channel does not have a select code already associated therewith, the operator is prompted at block 142 with "RESTRICTED CHANNEL?" to insure that the operator intends for the particular channel to be restricted. The operator responds at block 144 with "1" for "yes" or "0" for "no", followed by the enter key at block 146. If the response was "0", a display of "TOO MANY DIGITS" is shown at block 148, until the operator actuates the "clear" key at block 150 to return the program to block 94. If the response was "1", the operator is next prompted at block 152 with "DISPLAY=_____".

The operator enters, block 154, the desired display code to be presented whenever the channel in question is selected, followed by the enter key at block 156.

At block 158, the program then enters the tuner channel, select code, and display code into the memory cue. This data is preferably entered in order of tuner channel designation, to further make difficult entry of the select code by an unauthorized operator. The program then pauses until the program switch is actuated to take the apparatus out of the control mode.

Figure 6A:
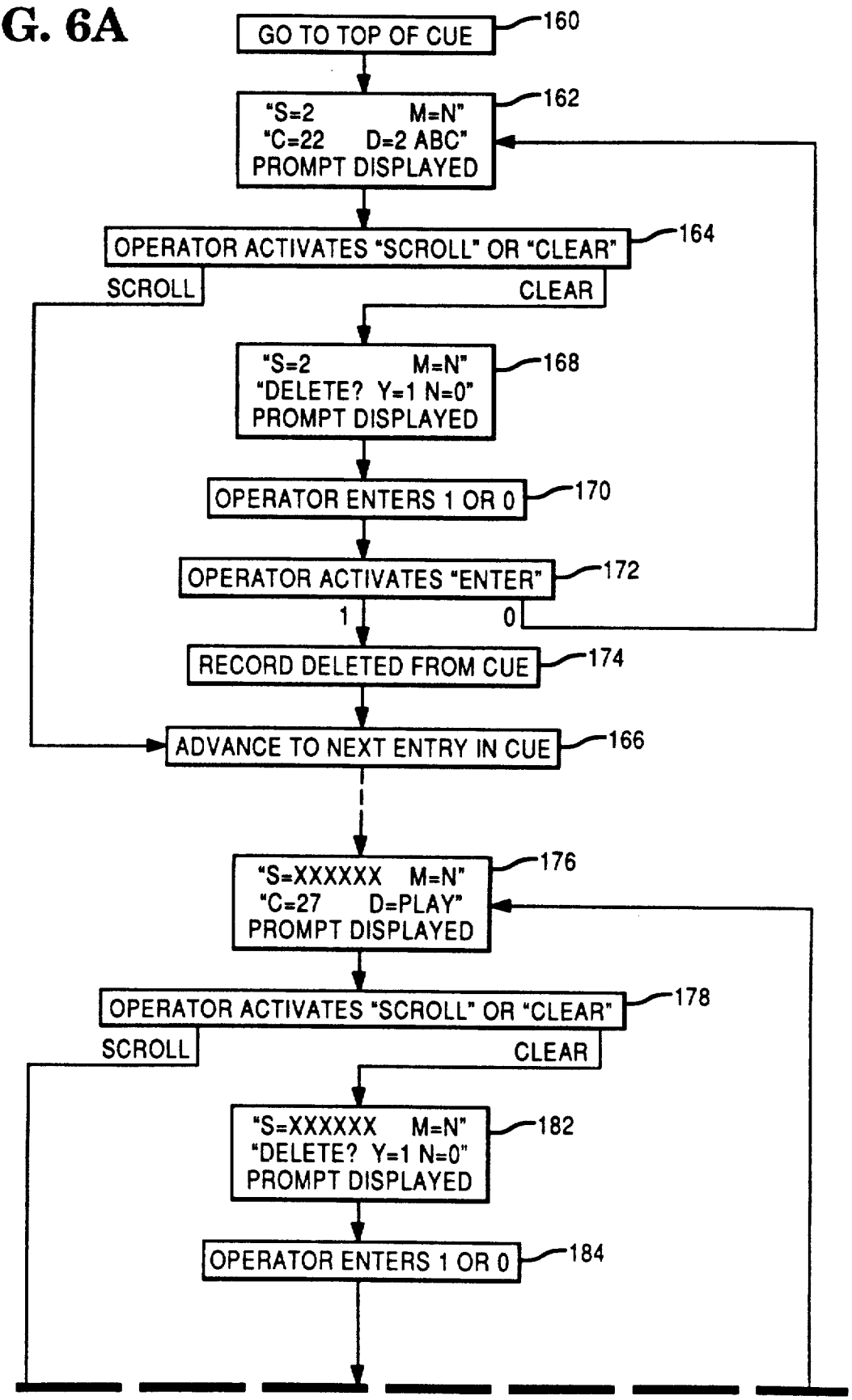
Figure 6B:
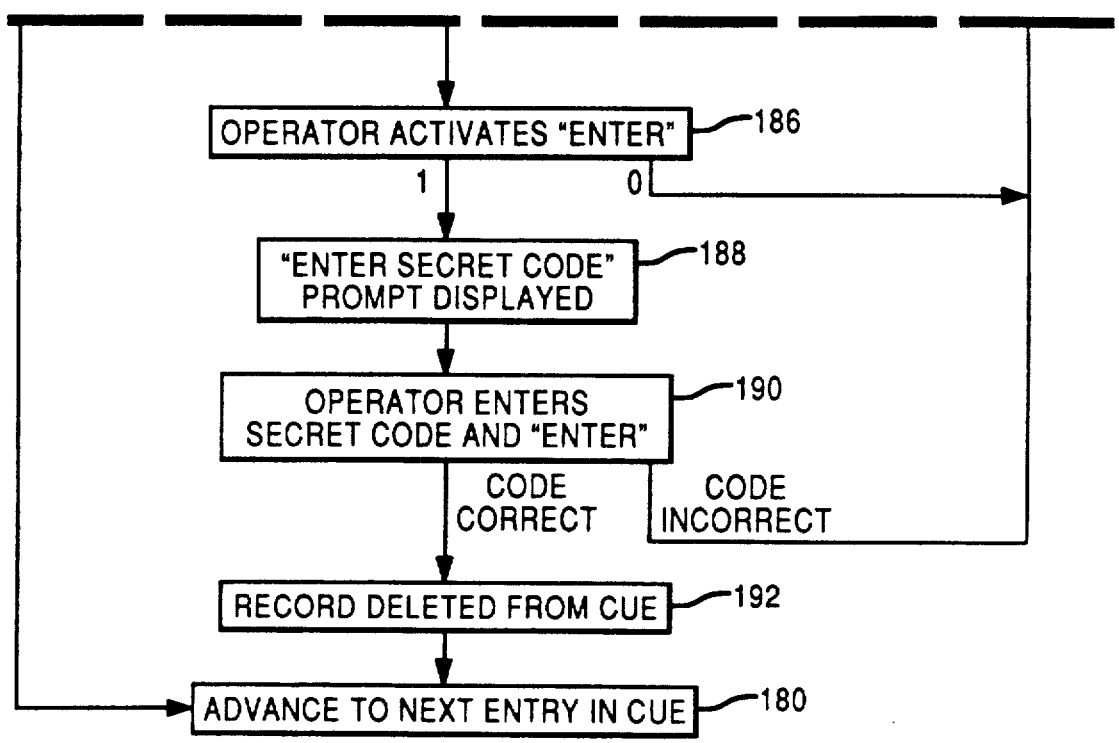

The final portion of the program mode of the control system is the "SCROLL SELECT", entered form block 78 of FIG. 4, and which enables the operator to review the memory cue and codes contained therein. Referring now to FIG. 6 (comprising FIGS. 6A and 6B), the program initially begins at the top of the cue, block 160, and displays the initial entry, showing its channel code, select code, display code and whether a marker bit has been entered for scrolling during channel selection. A sample display for an unrestricted channel selection is shown in block 162.

At this point, the operator may enter, block 164, either the "scroll" key or the "clear" key. In the former case, the program simply scrolls ahead to the next item in the cue, block 166. In the latter, the operator is prompted with "DELETE, Y=1 N=0", block 168. The operator then enters either "1" or "0", block 170, followed by the enter key, block 172. If the operator chooses "1", the cue entry is deleted, block 174, and the program scrolls forward to the next entry in the cue, block 166. If the operator chooses "0", the program returns to block 162 where the cue entry is simply displayed.

It should be noted that in a preferred embodiment, preprogrammed entries in memory are provided initially wherein the select code and display code are simply the same as the channel code. These entries are written over as select codes are chosen for the various channels. However, in the event all display codes for a given channel are deleted, the memory may be designed to reinstate the original entry for that channel code, so that such channel may be chosen by entering its tuner designation. A particular advantage of this feature is that the remote unit may be operated immediately to control the television receiver without programming.

A sample cue display for a restricted channel may be seen in block 176. It will be noted that the select code is shown as "S=XXXXXX", with the characters "X" used in place of the actual characters of the code. The operator enters, at block 178, either the "scroll" or "clear" key, with use of the scroll key advancing the scroll to the next item in the cue, block 180. If the clear key is used, the prompt "DELETE Y=1, N=0" is shown, block 182. The operator enters "1" or "0", block 184, followed by the enter key, block 186. If "0" is entered, the original display is again shown, block 176. If "1" is entered, the operator is prompted "ENTER SECRET CODE NOW", block 188, whereafter the operator must respond with the same secret code used to select the restricted channel followed by the enter key, block 190. Only if the correct code is entered is the entry deleted from the cue, block 192. Entry of an incorrect code returns the program to block 176. After deleting the entry, the program moves to the next record in the cue, block 182.

In the normal channel selection mode of operation, channels may be selected either by select code entry or by scrolling. In the case of scrolling, no flowchart is presented due to the simplicity of the operation. Each time the "scroll" key is actuated, the program advances to the next item in the cue. This entry is checked for the presence of a marker bit. If none is found, the program simply advances through the cue until a marker is found. The corresponding channel is then displayed on the screen, and the appropriate display code is also presented. Such routine is appropriate whether the "scroll up" key 58 or the "scroll down" key 59 is actuated; the particular key simply affects the direction of advance through the cue.

Figure 7A:
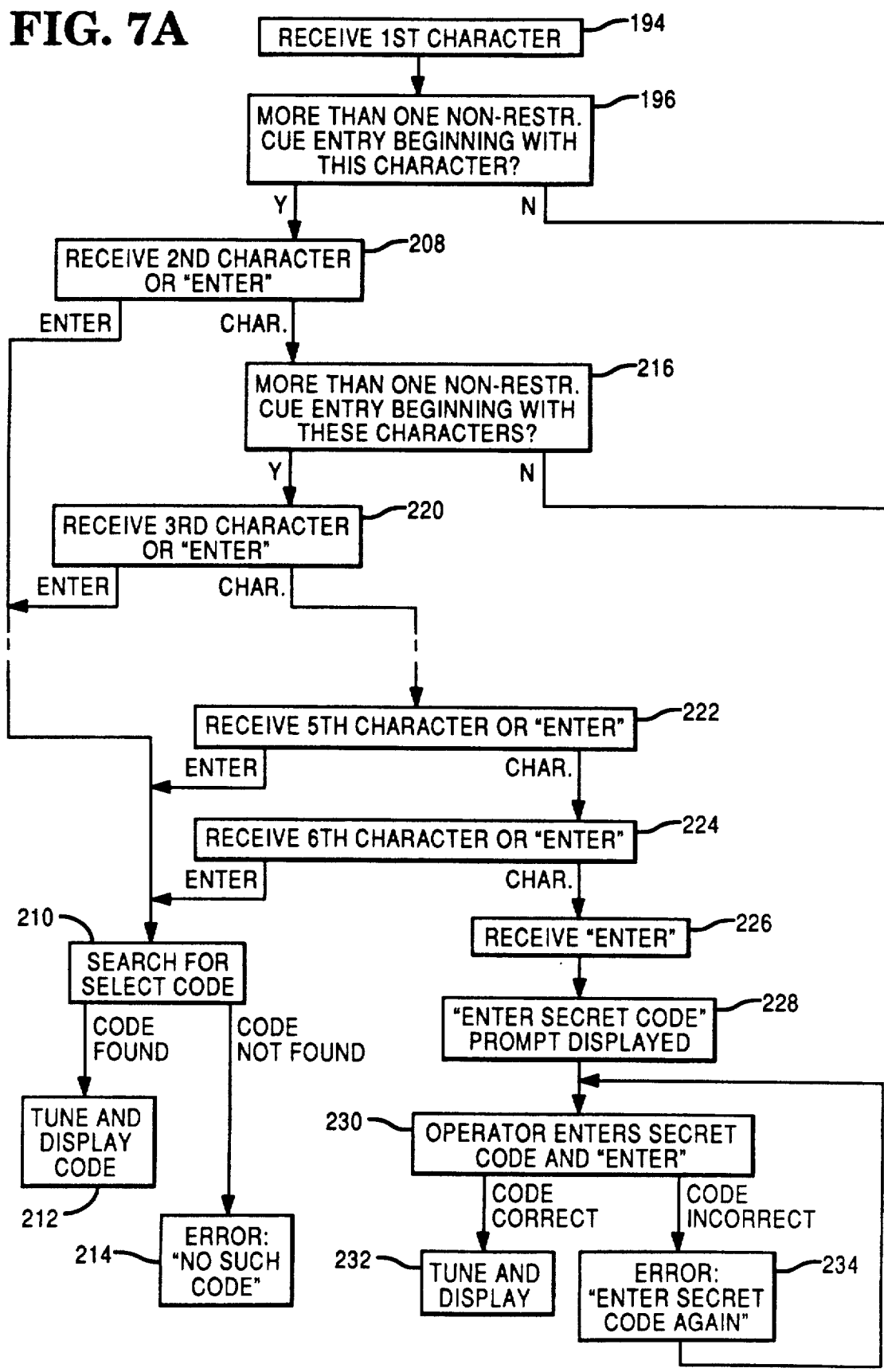
Figure 7B:
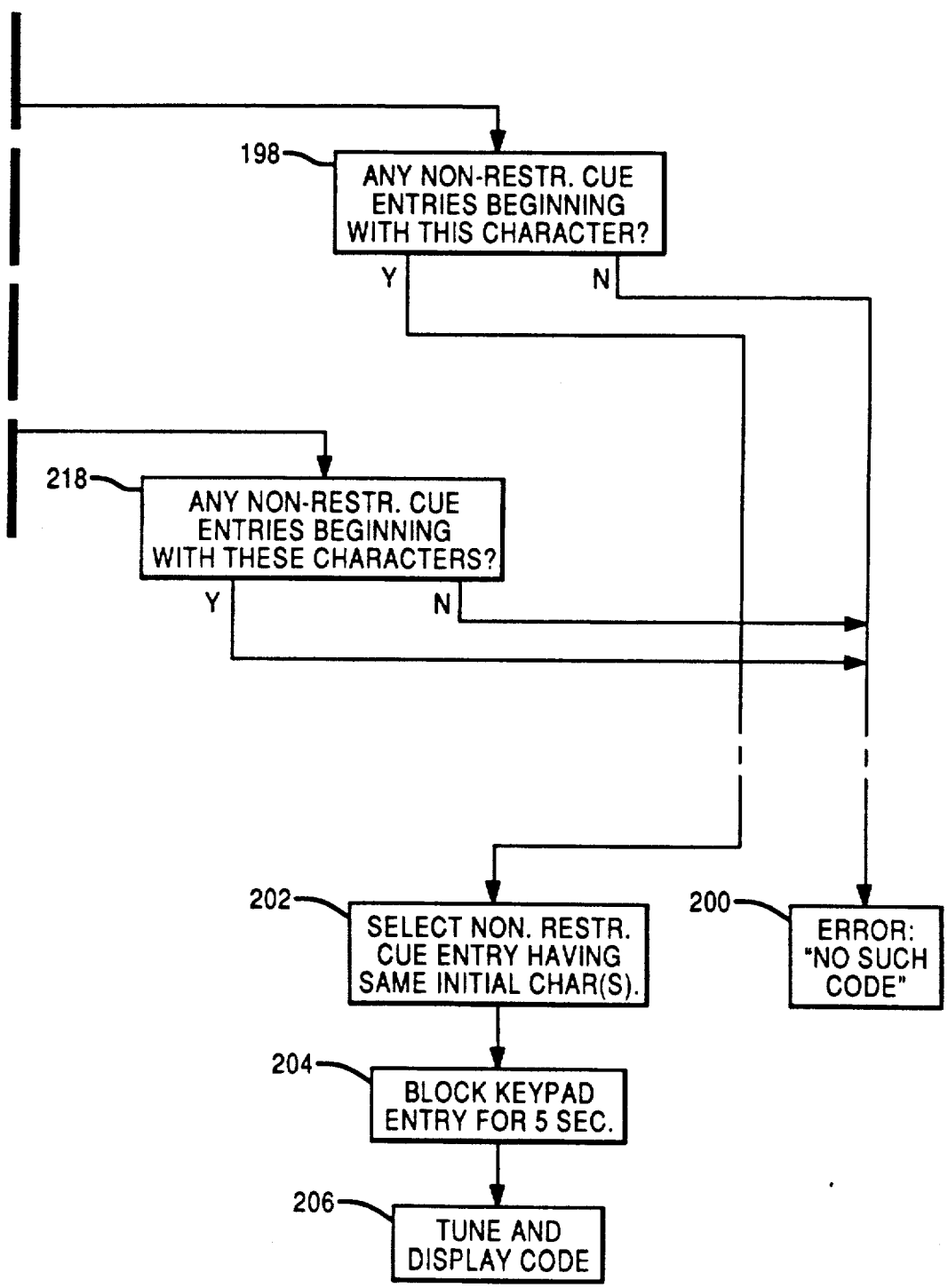
Figure 3:
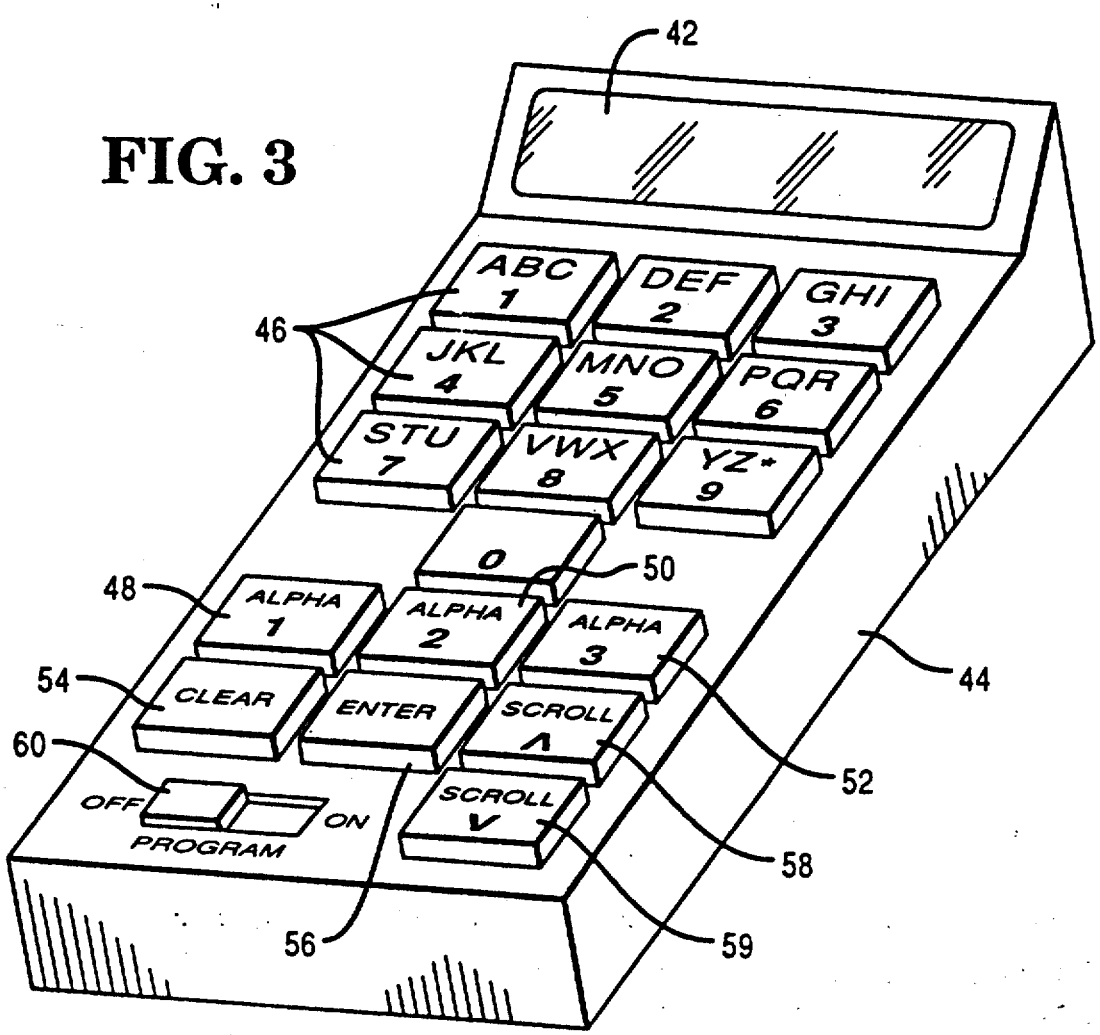
Figure 7B:
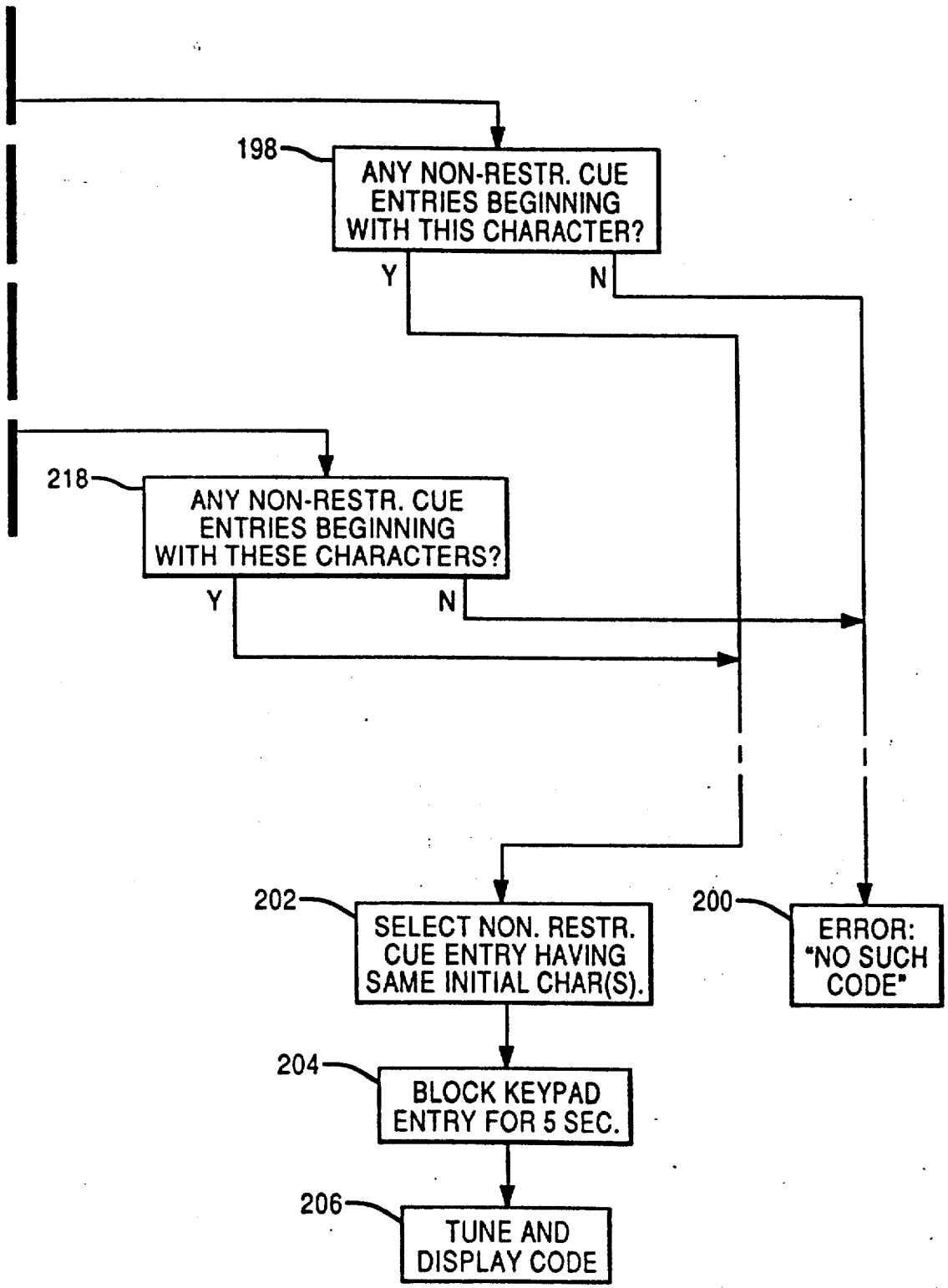

Channel selection may be seen by reference to FIG. 7 (comprising FIGS. 7A and 7B). For channel selection, the operator enters the select code for the desired channel, followed by the enter key. However, provision is made within the program for selection of the desired channel after entry of less than all the characters of the select code if such characters are unique to a single code. In other words, if the operator has entered a display code "225" for a particular channel and no other display code begins with the numeral "2", entry of the single character "2" will cause tuning of the receiver to the channel identified by the full code "225".

Select codes comprising alphabetic characters may be handled in several manners, as will be appreciated by those skilled in the art, depending upon the details of the program. As one alternative, a select code may be initially entered using the alphabetic designations of the keys (and using the appropriate "alpha" keys; see FIG.

3), but may be recalled for channel selection using only the numeric designations of the corresponding keys. For example, a select code "ABC" may be originally entered using the keystrokes (see FIG. 3) "alpha 1" key, "A (or 1)" key, "alpha 2" key, "B (or 1)" key, "alpha 3" key and "C (or 1)" key. Channel selection may be made simply by actuating "1", "1", "1".

Such an approach may be disadvantageous in that it precludes other select codes such as "111", "CBA" or "B11". Thus, as a further alternative, the program may be written to permit selection of select codes containing alphabetic characters using corresponding numerals only if no conflict exists. Otherwise, the select code must be entered using the "alpha" keys.

Referring now to FIG. 7, the initial character is received at block 194. Immediately, the program checks at block 196 to determine whether more than one non-restricted select code begins with the entered character. (Restricted channels are treated as special cases and require entry of all six characters, followed by entry of the secret code.) If there is no more than one select code beginning with the entered character, the program checks at block 198 whether there are any entries which begin with the initial character. If not, an error message is given, block 200, and the program erases the entered character and awaits further input.

If at block 198 a single select code beginning with the first character is found, the program moves to block 202 where the select code having the entered initial character is selected from the non-restricted cue. At block 204, further keypad entry is temporarily blocked to avoid processing any further characters, and the selected channel is tuned and the corresponding display code is presented, block 206.

Returning to block 196, if more than one select code begins with the entered initial character, the program proceeds to block 208 where the next keystroke, either a further character or the enter key, is received. If the keystroke is the enter key, the display code has been completely entered (consisting of one character). At block 208, a search for the entered select code is performed, and if such a code is found, the appropriate channel is tuned and display code is presented, block 212. If no such code is found, an error message such as "NO SUCH CODE" is presented, block 214.

At block 208, the next keystroke may be a second character. As before, at block 216, a check is made as to whether more than one display code begins with the first two characters. If not, and if in fact no such display codes so begin, block 218, the appropriate error message is shown, block 200. If from block 218 a single corresponding select code is found, the corresponding channel is selected, blocks 202, 204 and 206. If more than one select code begins with the two entered characters at block 216, then a third character or an enter key is awaited at block 220.

Similar processing of the third and fourth characters, if any, are performed. Such operations are not shown in FIG. 7 except by broken lines, but will be readily understood.

At block 222, the next entry can be either a fifth character or the enter key following the fourth character. If an enter key, the program proceeds to block 210 to work with the entered select code. If a fifth character, there is no need to consider whether more than one non-restricted code begin with the initial five characters since such a situation is not possible, and the program accordingly at block 224 awaits the entry of the enter key or a sixth character. If an enter key is received, the program moves to block 210. If a sixth character is received, the operator has requested a restricted channel.

After receiving the sixth character at block 224, the program awaits an enter key at block 226. At block 228, the message "ENTER SECRET CODE" is displayed. The operator enters the secret code followed by an enter key at block 230, whereafter the code is checked to determine whether it is valid. If the code is correct, the selected channel is tuned and the corresponding display code is shown at block 232. If the code is incorrect, the error message "ENTER CODE AGAIN" is given at block 234, with the program returning to block 230 to await reentry of the secret code.

Throughout the channel selection routine, entry of the clear key will interrupt the channel selection program and return the program to a standby mode.

Other alternatives to the foregoing program will be readily apparent to those skilled in the art. What is important is that means be provided whereby the user may enter his own selected designations for available channels, and that those user-designated channel identifications be used in selecting a channel for viewing.

However, it will be recognized that the processor, whether incorporated in the television receiver or in a hand-held remote, may be used to perform other tasks in addition to enabling user-designations to identify particular available channels. For example, a clock circuit may be included, whereby restricting of channels unless the proper code is entered may be made necessary only during preselected days and/or times. In this way, parents for example may preclude children from viewing particular programs while leaving the channel in question available at other times. The manner in which the processor may be programmed to carry out this feature will be readily apparent to those skilled in the art.

Another additional feature may be incorporated with respect to the "scroll" ability of the control system. As described in connection with the preferred embodiment, a single, binary marker bit is used whereby a single scroll order is provided. However, it will be recognized that a multiple bit marker may be used. In such a case, it will be possible to create more than one scroll sequence. Such sequences may be used to create subject matter scrolls (e.g., news, educational programming, entertainment programming and the like), or individual scroll sequences for each member of the same household.

Further, the preferred embodiment is described as incorporating an easily accessible program switch. It should be recognized, however, that the present invention may also be used in embodiments wherein programming of the control system, while similar in operating concept, is more difficult to carry out. For example, hotels may wish to locate programming switches as DIP switches or the like positioned internally of the television receiver and/or remote unit to prevent guests from programming the units in a nonuniform manner. Alternatively, programming could be carried out remote from the unit, such as by utilizing a removable chip for the system memory. As yet a further alternative, the television receiver could include an accessible data port. In such a case, again using a hotel as an example, access to "premium" channels such as movie channels could be authorized only by office personnel through the data port.

It will also be recognized that while frequent reference is made herein to a "television receiver", such reference is intended to include not only conventional television sets, but also videocassette recorders, satellite receivers, or any other apparatus capable of tuning a television signal from a multiple-channel source.

While the methods described herein, and the apparatus for carrying these methods into effect, constitute preferred embodiments of the present invention, it should be recognized that changes may be made therein without departing from the scope of the present invention, which is defined in the appended claims.

What is claimed is:

1. In a television control system apparatus for selecting a television channel corresponding to a preassigned channel tuning designation, the system apparatus comprising:
   tuner means for receiving a processor signal and a multi-channel input signal, and in response to said processor signal, tuning out all but one channel corresponding to a selected one of said preassigned channel tuning designations;
   memory means for storing at least one operator-assigned channel select designation for at least one of said channel tuning designations;
   operator-actuated control means for generating a control output signal comprising one of (a) a first data set representative of a desired channel select designation for one of said channel tuning designations, and (b) a second data set representative of a desired viewing channel identified by an operator selected one of said channel select designations;
   processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation.

2. Apparatus as defined in claim 1, wherein said operator actuated control means includes an alpha- and/or numeric keypad, said control output signal comprising a string of alpha- and/or numeric characters generated in response to actuation of said keypad.

3. Apparatus as defined in claim 2, wherein said keypad includes a plurality of alpha/numeric keys, each of said alpha/numeric keys corresponding to at least one numeric character and to at least one alphabetic character, and wherein said keypad includes at least one alpha control key, said control means including means for generating said control output signal to correspond to actuated ones of said alpha/numeric and alpha control keys, and wherein said processor means includes means for interpreting said control output signal as comprising alphabetic and numeric characters corresponding to actuated ones of said alpha/numeric keys wherein actuation of said alpha control key immediately preceding actuation of one of said alpha/numeric keys causes said processor means to interpret said alpha/numeric key as corresponding to the alphabetic character associated therewith.

4. Apparatus as defined in claim 3, wherein said processor means includes means for causing said memory means to store channel select designations comprising both alphabetic and numeric characters, and means for retrieving from said memory means one of said channel tuning designations in response to receipt of a second data set comprising only numeric characters generated in response to actuation of ones of said keys corresponding to alphabetic characters within the corresponding one of said channel select designations.

5. Apparatus as defined in claim 2, further comprising a remote housing for mounting said keypad, and means for transmitting said control output signal from said housing to said processor means.

6. Apparatus as defined in claim 5, wherein said transmitting means includes means for encoding said control signal as an infrared data stream, means for transmitting said infrared data stream, and means connected to said processor means for receiving said infrared data stream.

7. Apparatus as defined in claim 2, further comprising a remote housing for mounting said keypad, said processor means and said memory means, and means for transmitting said processor signal from said housing to said tuner means.

8. Apparatus as defined in claim 7, wherein said transmitting means includes means for encoding said processor signal as an infrared data stream, means for transmitting said infrared data stream, and means connected to said tuner means for receiving said infrared data stream.

9. Apparatus as defined in claim 1, further comprising:
   display means for receiving a display signal and displaying characters corresponding thereto;
   said memory means including means for storing at least one series of display characters;
   said control means including means for generating a part of said first data set representative of a desired one of said series of characters for each of said channel select designations; and
   said processor means including means for, upon receipt of said first data set, additionally causing said memory means to store said desired series of characters as corresponding to one of said channel select designations, and upon receipt of said second data set, retrieving from said memory means the one of said series of characters corresponding to said operator selected channel select designation, and generating said display signal to correspond to said series of characters for output to said display means.

10. Apparatus as defined in claim 1, wherein:
    said memory means includes means for initially storing a channel select designation for each of said channel tuning designations which is identical thereto;
    said operator-actuated control means including means for generating a memory clear signal;
    said processor means including means for receiving said memory clear signal, and in response thereto, clearing said memory and restoring therein said channel select designation for each of said channel tuning designations which is identical thereto.

11. Apparatus as defined in claim 1, wherein:
    said memory means includes means for storing at least one marker bit for each of said channel select designations, and means for retaining said channel select designations in an ordered cue;
    said control means includes means for generating, at the selection of the operator, a part of said first data set representative of the presence of said marker bit associated with one of said channel select designations, and means for generating a third data set representative of a command to advance to a subsequent channel select designation within said cue;

said processor means, upon receipt of said first data set, causing said memory means to store any of said marker bits associated with one of said channel select designations, and upon receipt of said third data set, reviewing said cue to determine a next of said channel select designations to have one of said marker bits associated therewith, and generating said processor signal to correspond to said next channel select designation.

12. Apparatus as defined in claim 11, wherein:

said memory means includes means for storing at least one order bit for each of said channel select designations which comprises said means for retaining said channel select designations in said ordered cue;

said processor means, upon receipt of said first data set, causing said memory means to store an order bit associated with said channel select designation corresponding to the respective place of said channel select designation within said cue, and upon receipt of said third data signal, determining said next of said channel select designations by reviewing said order bits.

13. Apparatus as defined in claim 1, wherein:

said memory means includes means for storing in association with at least one of said channel select designations means for denoting said one channel select designation as restricted;

said control means including means for generating said first data set to include said means for denoting said one channel select designation as restricted, and means for generating a third data set representative of an authorization code;

said processor means, upon receipt of said first data set, causing said memory means to store said means for denoting said one channel select designation as restricted and, upon receipt of said second data set, in the event said operator selected channel select designation has associated therewith means for denoting said channel select designation as restricted, preventing generation of said processor signal unless and until receipt of said third data set.

14. In a television control system apparatus for selecting a television channel corresponding to a preassigned channel tuning designation, the system apparatus comprising:

tuner means for receiving a processor signal and a multi-channel input signal, and in response to said processor signal, tuning out all but one channel corresponding to a selected one of said preassigned channel tuning designations;

memory means for storing at least one operator-assigned channel select designation for at least one of said channel tuning designations;

first operator-actuated control means for generating a first control output signal comprising a first data set representative of a desired channel select designation for one of said channel tuning designations;

second operator-actuated control means for generating a second control output signal comprising a second data set representative of a desired viewing channel identified by an operator selected one of said channel select designations;

processor means for receiving said first and second control output signals from said first and second operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation.

15. Apparatus as defined in claim 14, wherein said first operator actuated control means is remote from said second operator actuated control means.

16. Apparatus as defined in claim 15, further comprising a data input port connected to said processor means, and means for supplying said first control output signal to said port for receipt by said processor means.

17. In a television control system apparatus for selecting a television channel corresponding to a preassigned channel tuning designation, the system apparatus comprising:

tuner means for receiving a processor signal and a multi-channel input signal, and in response to said processor signal, tuning out all but one channel corresponding to a selected one of said preassigned channel tuning designations;

memory means for storing at least one operator-assigned channel select designation for at least one of said channel tuning designations;

first operator-actuated control means for generating a first control output signal comprising a first data set representative of a desired channel select designation for one of said channel tuning designations;

means for receiving said first data set and causing said memory means to store said desired channel select designation as corresponding to said one channel tuning designation;

second operator-actuated control means for generating a second control output signal comprising a second data set representative of a desired viewing channel identified by an operator selected one of said channel select designations;

processor means for receiving said second control output signal from said second operator-actuated control means, and upon receipt thereof, retrieving from said memory means the one of said channel tuning designations corresponding to said operator selected channel select designation, and generating said processor signal to correspond to said one channel tuning designation.

18. Apparatus as defined in claim 17, wherein said first operator-actuated control means and said means for receiving said first data set are remote from said second operator actuated-control means and said processor means, and further comprising first means for removably receiving said memory means connected to said means for receiving said first data set, and second means for removably receiving said memory means connected to said processor means, whereby said memory means may be programmed by said first operator-actuated control means and removed to said second receiving means for access by said processor means.

19. Apparatus for controlling a television receiver capable of receiving a plurality of channels and displaying a selected one of said channels to a viewer, each of said channels being identified by a preassigned symbol, said controlling apparatus comprising:

viewer input means for entering a viewer selected symbol corresponding to each of said preassigned symbols, and for entering a viewer selected display label corresponding to each of said viewer selected symbols;

memory means for retaining said viewer selected symbols, said viewer selected display labels, and correspondence therebetween and said preassigned symbols;

channel selection input means for receiving a viewer selected symbol; and channel selection control means for correlating said viewer selected symbol, a corresponding one of said viewer selected display labels, and a corresponding one of said preassigned symbols, and for controlling said television receiver to display the channel corresponding to said one preassigned symbol and to display said viewer selected display label.

20. The control apparatus of claim 19, wherein said preassigned symbols and said viewer selected symbols are comprised of numeric and/or alphabetic characters, and wherein said viewer input means is a numeric and/or alphabetic keypad.

21. The control apparatus of claim 20, wherein said channel selection means includes said keypad.

22. In a television control system apparatus for selecting a television channel corresponding to a preassigned channel tuning designation, the system apparatus comprising:

tuner means for receiving a processor signal and a multi-channel input signal, and in response to said processor signal, tuning out all but one channel corresponding to a selected one of said preassigned channel tuning designations;

memory means for storing at least one channel select designation different from but corresponding to at least one of said channel tuning designations, and for storing at least one display designation different from but corresponding to at least one of said channel select designations;

operator-actuated control means for generating a control output signal comprising a data set representative of a desired viewing channel identified by an operator selected one of said channel select designations;

a display;

processor means for receiving said control output signal from said operator-actuated control means, and upon receipt of said data set, retrieving from said memory means the one of said channel tuning designations and the one of said display designations corresponding to said operator selected channel select designation, generating said processor signal to correspond to said one channel tuning designation, said processor means being connected to said display and causing said display designation to appear on said display.

23. Apparatus as defined in claim 22, wherein said display includes a television screen.

24. Apparatus as defined in claim 22, wherein said display includes an alpha-numeric display device.

25. Apparatus as defined in claim 1, wherein said memory means includes means for storing more than one of said channel select designations corresponding to a single one of said channel tuning designations.

26. Apparatus as defined in claim 2, wherein said string of alpha- and/or numeric characters includes an initial character which is a numeric character.

27. Apparatus as defined in claim 1, wherein:

said memory means includes means for storing a marker value for each of said channel select designations, and means for retaining said channel select designations in a plurality of ordered cues;

said control means including means for generating, at the selection of the operator, a part of said first data set representative of the presence of said marker value associated with one of said channel select designations and one of said cues, and means for generating a third data set representative of a command to advance to a subsequent channel designation within a selected one of said cues;

said processor means, upon receipt of said first data set, causing said memory means to store any of said marker values associated with one of said channel select designations, and upon receipt of said third data set, reviewing the corresponding one of said cues to determine a next of said channel select designations to ave one of said marker values associated therewith which corresponds to said cue, and generating said processor signal to correspond to said next channel select designation.

28. Apparatus as defined in claim 1, wherein at least some of said channel select designations include more than one character, and wherein said processor means includes means for receiving said second data set as sequential ones of said characters, and upon receipt of each of said characters, scanning said memory means for other of said channel select designations having identical ones of said characters received, and upon locating only a single one of said channel select designations having said ones of said characters received, generating said processor signal to correspond to said one channel tuning designation, whereby said processor signal may be generated upon receipt of less than all of said characters of said channel select designations.

* * * * *

REEXAMINATION CERTIFICATE (2118th)
United States Patent [19]
Beery

[11] B1 5,068,734
[45] Certificate Issued Oct. 26, 1993

[54] APPARATUS FOR CONTROLLING A TELEVISION RECEIVER

[76] Inventor: Jack Beery, 907 6th St. SW., Apt. 815 C, Washington, D.C. 20024

Reexamination Request:
No. 90/002,829, Sep. 8, 1992

Reexamination Certificate for:
Patent No.: 5,068,734
Issued: Nov. 26, 1991
Appl. No.: 359,155
Filed: May 31, 1989

[51] Int. Cl.⁵ .................................... H04N 5/50
[52] U.S. Cl. .......................... 358/191.1; 358/192.1; 455/186.1
[58] Field of Search .......... 455/151, 154, 158, 186.1; 358/191.1, 192.1, 194.1

[56] References Cited

U.S. PATENT DOCUMENTS

| | | | |
|---|---|---|---|
| 4,314,375 | 2/1982 | Belisomi | 455/158.5 |
| 4,317,225 | 2/1982 | Henderson | 455/185.5 |
| 4,355,415 | 10/1982 | George et al. | 455/185.1 |
| 4,375,651 | 3/1983 | Templin et al. | 358/191.1 |
| 4,419,769 | 12/1983 | Cohen | 455/186.1 |
| 4,510,623 | 4/1985 | Bonneau et al. | 455/181 |
| 4,527,194 | 7/1985 | Sirazi | 358/192.1 X |
| 4,559,561 | 12/1985 | Amano et al. | 358/192.1 |
| 4,600,918 | 7/1986 | Belisomi et al. | 340/711 |
| 4,620,229 | 10/1986 | Amano et al. | 358/192.1 X |
| 4,706,121 | 11/1987 | Young . | |
| 4,751,578 | 6/1988 | Reiter et al. | 358/194.1 X |
| 4,870,492 | 9/1989 | Hakamada et al. | 358/193.1 |
| 4,907,085 | 3/1990 | Bingham | 358/192.1 |
| 4,914,517 | 4/1990 | Duffield | 455/186.1 |
| 4,959,720 | 9/1990 | Duffield et al. | 358/191.1 |
| 4,977,455 | 12/1990 | Young . | |

FOREIGN PATENT DOCUMENTS

0219703  4/1987  European Pat. Off. .

OTHER PUBLICATIONS

Patent Abstracts of Japan, vol. 12, No. 246, Jul. 12, 1988, citing JP-A-63 036 608 (Sony Corp.)

*Primary Examiner*—Mark R. Powell

[57] ABSTRACT

A television control system is for selecting a television channel corresponding to a preassigned channel tuning designation. A tuner receives a multi-channel input signal, and in response to a processor signal, tunes out all but one selected channel. A memory stores at least one operator-assigned channel select designation for the channel tuning designations. An operator-actuated control means generates a first data signal representative of a desired channel select designation for one of the channel tuning designations, and a second data signal representative of a desired viewing channel identified by one of the channel select designations. A processor receives the first data signal from the control means, and in response, causes the memory to store the desired channel select designation as corresponding to the tuning designation. Upon receipt of the second data signal, the processor retrieves from the memory the channel tuning designation corresponding to the channel select designation, and generates the processor signal to correspond to the channel tuning designation.

36 Claims, 2 Drawing Sheets

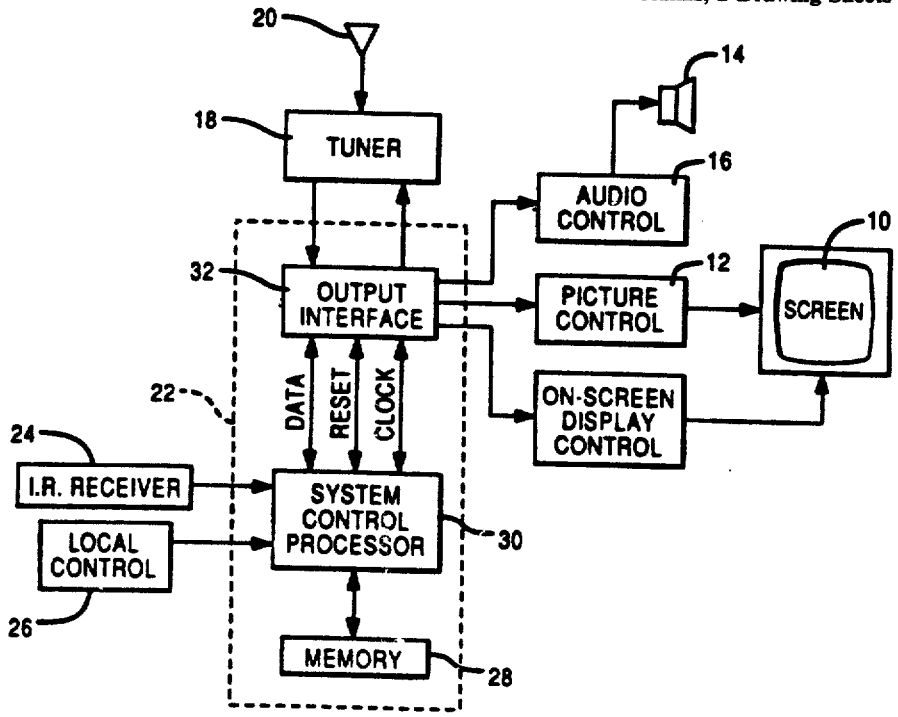

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

The drawing figures have been changed as follows: in Fig. 3 "aplha" changed to "alpha" in FIG. 7b extension of line "y" from 218 to line "n" from 198 deleted.

ONLY THOSE PARAGRAPHS OF THE SPECIFICATION AFFECTED BY AMENDMENT ARE PRINTED HEREIN.

Column 10, lines 51-63:
Channel selection may be seen by reference to FIG. 7 (comprising FIGS. 7A and 7B). For channel selection, the operator enters the select code for the desired channel, followed by the enter key. However, provision is made within the program for selection of the desired channel after entry of less than all the characters of the select code if such characters are unique to a single code. In other words, if the operator has entered a [display] *select* code "225" for a particular channel and no other [display] *select* code begins with the numeral "2", entry of the single character "2" will cause tuning of the receiver to the channel identified by the full code "225".

Column 11, lines 35-45:
Returning to block 196, if more than one select code begins with the entered initial character, the program proceeds to block 208 where the next keystroke, either a further character or the enter key, is received. If the keystroke is the enter key, the display code has been completely entered (consisting of one character). A block [208] *210*, a search for the entered select code is performed, and if such a code is found, the appropriate channel is tuned and display code is presented, block 212. If no such code is found, an error message such as "NO SUCH CODE" is presented, block 214.

AS A RESULT OF REEXAMINATION, IT HAS BEEN DETETERMINED THAT:

The patentability of claims 14-18 and 22-24 are confirmed.
Claims 19-21 are cancelled.
Claims 1, 4, 10, 11, 13, 25, 27 and 28 are determined to be patentable as amended.
Claims 2, 3, 5-9, 12, and 26 dependent on an amended claim, are determined to be patentable,
New claims 29-36 are added and determined to be patentable.

1. In a television control system apparatus for selecting a television channel corresponding to a preassigned channel tuning designation, the system appartus comprising:
  tuner means for receiving a processor signal and a multichannel input signal, and in response to said processor signal, tuning out all but one channel corresponding to a selected one of said preassigned channel tuning designations;
  memory means for storing at least one operator-assigned channel select designation for at least one of said channel tuning designations;
  operator-actuated control means for generating a control output signal *including a string of two or more label characters and* comprising one of (a) a first data set representative *at least in part* of a desired channel select designation for one of said channel tuning designations, and (b) a second data set *having as its initial character one of said label characters and* representative of a desired viewing channel identified by an operator selected one of said channel select designations;
  processor means for receiving said control output signal from said operator-actuated control means, and upon receipt of said first data set, causing said memory means to store said desired channel select designation as corresponding to said one channel tuning designation, and upon receipt *solely* of said second data set, retrieving from said memory means the one of said channel tuning designations corresponding to said operator selected channel select designation, and generating said processor signal to correspond to said one channel tuning designation.

4. [Apparatus as defined in claim 3,] *In a television control system apparatus for selecting a television channel corresponding to a preassigned channel tuning designation, the system apparatus comprising:*
  *tuner means for receiving a processor signal and a multichannel input signal, and in response to said processor signal, tuning out all but one channel corresponding to a selected one of said preassigned channel tuning designations;*
  *memory means for storing at least one operator-assigned channel select designation for at least one of said channel tuning designations;*
  *operator-actuated control means for generating a control output signal comprising one of (a) a first data set representative of a desired channel select designation for one of said channel tuning designations, and (b) a second data set representative of a desired viewing channel identified by an operator selected one of said channel select designations;*
  *processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;*
  *wherein said operator actuated control means includes an alpha- and/or numeric keypad, said control output signal comprising a string of alpha- and/or numeric characters generated in response to actuation of said keypad;*
  *wherein said keypad includes a plurality of alpha/numeric keys, each of said alpha/numeric keys corresponding to at least one numeric character and to at least one alphabetic character, and wherein said keypad includes at least one alpha control key, said con-* trol means including means for generating said control output signal to correspond to actuated ones of said alpha/numeric and alpha control keys, and wherein said processor means includes means for interpreting said control output signal as comprising alphabetic and numeric characters corresponding to actuated ones of said alpha/numeric keys wherein actuation of said alpha control key immediately preceding actuation of one of said alpha/numeric keys causes said processor means to interpret said alpha/numeric key as corresponding to the alphabetic character associated therewith; and wherein said processor means includes means for causing said memory means to store channel select designations comprising both alphabetic and numeric characters, and means for retrieving from said memory means one of said channel tuning designations in response to receipt of a second data set comprising only numeric characters generated in response to actuation of ones of said keys corresponding to alphabetic characters within the corresponding one of said channel select designations.

10. [Apparatus as defined in claim 1,] *In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;*

*wherein[:] said memory means includes means for initially storing a channel select designation for each of said channel tuning designations which is identical thereto;*

*said operator-actuated control means including means for generating a memory clear signal;*

*said processor means including means for receiving said memory clear signal, and in response thereto, clearing said memory and restoring therein said channel select designation for each of said channel tuning designations which is identical thereto.*

11. [Apparatus as defined in caim 1,] *In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;*

*wherein[:] said memory means includes means for storing at least one marker bit for each of said channel select designations, and means for retaining said channel select designations in an ordered cue;*

*said control means includes means for generating, at the selection of the operator, a part of said first data set representative of the presence of said marker bit associated with one of said channel select designations, and means for generating a third data set representative of a command to advance to a subsequent channel select designation within said cue;*

*said processor means, upon receipt of said first data set, causing said memory means to store any of said marker bits associated with one of said channel select designations, and upon receipt of said third data set, reviewing said cue to determine a next of said channel select designations to have one of said marker bits associated therewith, and generating said processor signal to correspond to said next channel select designation.*

13. [Apparatus as defined in claim 1,] *In a television control system apparatus for selecting a television channel corresponding to a preassigned channel tuning designation, the system apparatus comprising:*

*tuner means for receiving a processor signal and a mutli-channel input signal, and in response to said processor signal, tuning out all but one channel corresponding to a selected one of said preassigned channel tuning designations;*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon* receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;

wherein [:] said memory means includes means for storing in association with at least one of said channel select designations means for denoting said one channel select designation as restricted;

said control means including means for generating said first data set to include said means for denoting said one channel select designation as restricted, and means for generating a third data set representative of an authorization code;

said processor means, upon receipt of said first data set, causing said memory means to store said means for denoting said one channel select designation as restricted and, upon receipt of said second data set, in the event said operator selected channel select designation has associated therewith means for denoting said channel select designation as restricted, preventing generation of said processor signal unless and until receipt of said third data set.

25. [Apparatus as defined in claim 1,] *In a television control system apparatus for selecting a televsion channel corresponding to a preassigned channel tuning designation, the system apparatus comprising:*

*tuner means for receiving a processor signal and a multichannel input signal, and in response to said processor signal, tuning out all but one channel corresponding to a selected one of said preassigned channel tuning designations;*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;* wherein said memory means includes means for storing more than one of said channel select designations corresponding to a single one of said channel tuning designations.

27. [Apparatus as defined in claim 1,] *In a television control system apparatus for selecting a television channel corresponding to a preassigned channel tuning designation, the system apparatus comprising:*

*tuner means for receiving a processor signal and a mutlichannel input signal, and in response to said processor signal, tuning out all but one channel corresponding to a selected one of said preassigned channel tuning designations;*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;* wherein [:] said memory means for storing a marker value for each of said channel select designations, and means for retaining said channel select designations in a plurality of ordered cues;

said control means including means for generating, at the selection of the operator, a part of said first data set representative of the presence of said marker value associated with one of said channel select designations and one of said cues, and means for generating a third data set representative of a command to advance to a subsequent channel select designation within a selected one of said cues;

said processor means, upon receipt of said first data set, causing said memory means to store any of said marker values associated with one of said channel select designations, and upon recepit of said third data set, reviewing the corresponding one of said cues to determine a next of said channel select designations to have one of said marker values associated therewith which corresponds to said cue, and generating said processor signal to correspond to said next channel select designation.

28. [Apparatus as defined in claim 1,] *In a television control system apparatus for selecting a television channel corresponding to a preassigned channel tuning designation, the system apparatus comprising:*

*tuner means for receiving a processor signal and a multichannel input signal, and in response to said processor signal, tuning out all but one channel corresponding to a selected one of said preassigned channel tuning designations;*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation* as corresponding to said one channel tuning designation, and upon receipt of said second data set, retrieving from said memory means the one of said channel tuning designations corresponding to said operator selected channel select designation, and generating said processor signal to correspond to said one channel tuning designation;

wherein at least some of said channel select designations include more than one character, and wherein said processor means includes means for receiving said second data set as sequential ones of said characters, and upon receipt of each of said characters, scanning said memory means for other of said channel select designations having identical ones of said characters received, and upon locating only a single one of said channel select designations having said ones of said characters received, generating said processor signal to correspond to said one channel tuning designation, whereby said processor signal may be generated upon receipt of less than all of said characters of said channel select designations.

29. In a television control system apparatus for selecting a television channel corresponding to a preassigned channel tuning designation, the system apparatus comprising:

tuner means for receiving a processor signal and a multichannel input signal, and in response to said processor signal, tuning out all but one channel corresponding to a selected one of said preassigned channel tuning designations;

memory means for storing at least one operator-assigned channel select designation for at least one of said channel tuning designations;

operator-actuated control means for generating a control output signal comprising one of (a) a first data set representative of a desired channel select designation for one of said channel tuning designations, and (b) a second data set representative of a desired viewing channel identified by an operator selected one of said channel select designations;

processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;

said memory means including means for initially storing a channel select designation for at least one of said channel tuning designations which is identical thereto.

30. Apparatus as defined in claim 29, wherein said operator actuated control means includes an alpha- and/or numeric keypad, said control output signal comprising a string of alpha- and/or numeric characters generated in response to actuation of said keypad.

31. Apparatus as defined in claim 30, wherein said keypad includes a plurality of alpha/numeric keys, each of said alpha/numeric keys corresponding to at least one numeric character and to at least one alphabetic character, and wherein said keypad includes at least one alpha control key, said control means including means for generating said control output signal to correspond to actuated ones of said alpha/numeric and alpha control keys, and wherein said processor means includes means for interpreting said control output signal as comprising alphabetic and numeric characters corresponding to actuated ones of said alpha/numeric keys wherein actuation of said alpha control key immediately preceding actuation of one of said alpha/numeric keys causes said processor means to interpret said alpha/numeric key as corresponding to the alphabetic character associated therewith.

32. Apparatus as defined in claim 30, further comprising a remote housing for mounting said keypad, and means for transmitting said control output signal from said housing to said processor means.

33. Apparatus as defined in claim 32, wherein said transmitting means includes means for encoding said control signal as an infrared data stream, means for transmitting said infrared data stream, and means connected to said processor means for receiving said infrared data stream.

34. Apparatus as defined in claim 30, further comprising a remote housing for mounting said keypad, said processor means and said memory means, and means for transmitting said processor signal from said housing to said tuner means.

35. Apparatus as defined in claim 34, wherein said transmitting means includes means for encoding said processor signal as an infrared data stream, means for transmitting said infrared data stream, and means connected to said tuner means for receiving said infrared data system.

36. Apparatus as defined in claim 30, wherein said string of alpha- and/or numeric characters includes an initial character which is a numeric character.

* * * * *